United States Patent [19]

Ferry et al.

[11] Patent Number: 5,111,075
[45] Date of Patent: May 5, 1992

[54] REDUCED SWITCHING NOISE OUTPUT BUFFER USING DIODE FOR QUICK TURN-OFF

[75] Inventors: Thomas V. Ferry, San Jose; Jamil Kawa, Santa Clara; Kerry M. Pierce, Fremont; William G. Walker, Saratoga; Michael A. Zampaglione, San Jose, all of Calif.

[73] Assignee: VLSI Technology, Inc., San Jose, Calif.

[21] Appl. No.: 665,385

[22] Filed: Mar. 5, 1991

Related U.S. Application Data

[63] Continuation-in-part of Ser. No. 316,894, Feb. 28, 1989, abandoned.

[51] Int. Cl.$^5$ ............................................. H03K 17/16
[52] U.S. Cl. .................................... 307/443; 307/263; 307/451
[58] Field of Search ............... 307/443, 448, 451, 475, 307/263, 594–597, 602–603

[56] References Cited

U.S. PATENT DOCUMENTS

| | | | |
|---|---|---|---|
| 4,725,747 | 2/1988 | Stein et al. | 307/579 |
| 4,771,195 | 9/1988 | Stein | 307/572 |
| 4,818,901 | 4/1989 | Young et al. | 307/263 X |
| 4,859,870 | 8/1989 | Wang et al. | 307/443 X |
| 4,918,339 | 4/1990 | Shigeo et al. | 307/443 X |
| 4,959,561 | 9/1990 | McDermott et al. | 307/443 |
| 4,959,565 | 9/1990 | Knecht et al. | 307/443 X |
| 4,961,010 | 10/1990 | Davis | 307/263 X |
| 4,992,676 | 2/1991 | Genosa et al. | 307/263 X |
| 5,036,232 | 7/1991 | Jangent et al. | 307/443 X |

*Primary Examiner*—David Hudspeth
*Attorney, Agent, or Firm*—Hickman & Frazzini

[57] ABSTRACT

A buffer characterized by a pull-up network and a pull-down network which are both coupled between an input and an output of the buffer. Each of the networks include a number of switch elements which can be sequentially turned on or off by means of an RC network to provide slew-rate control for the buffer. Preferably, each of the networks are associated with diode bypass networks to reduce crowbar current. In operation, both the pull-up network and the pull-down network turn on slowly but turn off very quickly due to the diode bypass networks.

19 Claims, 3 Drawing Sheets

REDUCED SWITCHING NOISE OUTPUT BUFFER USING DIODE FOR QUICK TURN-OFF

CROSS-REFERENCE TO RELATED APPLICATIONS

This application is a continuation-in-part (CIP) of copending application U.S. Ser. No. 07/316,894 filed Feb. 28, 1989 abandoned.

BACKGROUND OF THE INVENTION

This invention relates generally to electronic circuitry and more particularly to output buffers for digital integrated circuits.

Output buffers are used in digital integrated circuits (ICs) to drive an external load. Since the size of the load is not usually known, output buffers are designed to provide enough current to drive loads up to a maximum permissible level. This is typically accomplished by providing an output transistor large enough to drive the maximum permissible load or by providing a number of smaller transistors coupled in parallel to drive the maximum permissible load.

A problem is encountered when output buffers of the prior art are quickly turned on or off. Since the currents are so large, fast switching of the prior art buffers can cause transients such as noise spikes on the power, ground and data busses which can cause data errors, latch-up and other problems in the digital electronic circuitry. This problem can be reduced by a technique known as slew-rate control.

Slew rate is defined as the rate of output transition in volts per unit time as set forth below:

$$\text{Slew Rate} = \frac{\Delta V_{out}}{\Delta t}$$

Conventional digital output buffers with slew-rate control use a number of parallel transistors which can be sequentially turned on to reduce the abruptness of the transition and thereby reduce the aforementioned transients. The parallel transistors of the buffers can be controlled by delay elements or by feedback from the output of the buffer.

The transistors of a digital output buffer can be arranged as a pull-up network which can pull-up the output of the buffer to about $V_{dd}$ and a pull-down network which can pull down the output of the buffer to about $V_{ss}$. A problem encountered with slew-rate control is that as one of the networks of the buffer is being slowly turned on the other network of the buffer is being slowly turned off, resulting in a time when both networks are active simultaneously. This can allow a very large current known as a "crowbar" current to flow between $V_{dd}$ and $V_{ss}$.

This problem has been addressed in U.S. Pat. No. 4,725,747 of Stein et al. and U.S. Pat. No. 4,771,195 of Stein. In the Stein et al. '747 patent, a CMOS output buffer has a pull-up transistor 12 and a pull-down transistor 14 which can be individually and sequentially activated for slew-rate control. Transistors 36 are provided to quickly turn the pull-up transistor 12 off and transistors 40 are provided to quickly turn the pull-down transistor 14 off to minimize crowbar current.

A problem encountered with the buffer of the Stein et al. '747 patent is that the transistors 36 and 40 are active devices which require an input signal IN to control their operation. The input signal IN is inverted by a transistor 38 to controll pull-up transistor 12 and is inverted by a transistor 44 to control pull-down transistor 14. Unfortunately, this inversion requires that transistor 38 be of the opposite polarity of transistors 12 and 36 and thus must be formed in a separate well in the substrate than those transistors. Likewise, the inversion requires that transistor 44 is of the opposite polarity of transistors 14 and 40 and must be formed in a separate well in the substrate than those transistors. Since transistors 38 and 44 must be located separately from the transistors that they control, additional sets of interconnect lines are required to couple the transistors together, thereby increasing the complexity of the interconnect layer and the size of the circuit.

SUMMARY OF THE INVENTION

A digital output buffer is disclosed having both slew-rate control and crowbar current control. The buffer includes a pull-up circuitry and pull-down circuitry which turn on slowly but turn off quickly.

The pull-up circuitry includes a pull-up network and a diode bypass network. The pull-up network includes a number of p-channel MOSFETS which are sequentially activated by an RC network and which can be deactivated in parallel by the diode bypass network. Similarly, the pull-down circuitry includes a pull-down network and a diode bypass network, where the pull-down network includes a number of n-channel MOSFETS which are sequentially activated by an RC network and which can be deactivated in parallel by the diode bypass network.

The diode bypass networks include a number of MOSFET devices configured as passive, two terminal diodes. Since the diode bypass networks include only passive devices, no control signals need to be applied to the diode bypass networks to control their operation. This is advantageous because it eliminates a metal-layer interconnection which might otherwise be required. Furthermore, since the MOSFETS of the diode bypass networks can be of the same polarity as their associated pull-up or pull-down network, they can be formed in the same wells as their associated network to provide an easy to manufacture, compact and effective design.

The present method for slowing turning on one of the networks while quickly turning off the other network minimizes the crowbar current by minimizing the time when both networks might be simultaneously active. Thus, the present invention provides effective slew-rate control while minimizing excessive crowbar currents.

These and other advantages of the present invention will become clear to those skilled in the art upon a study of the detailed description of the invention and of the several figures of the drawings.

DETAILED DESCRIPTION OF THE PREFERRED EMBODIMENTS

Figure 1:
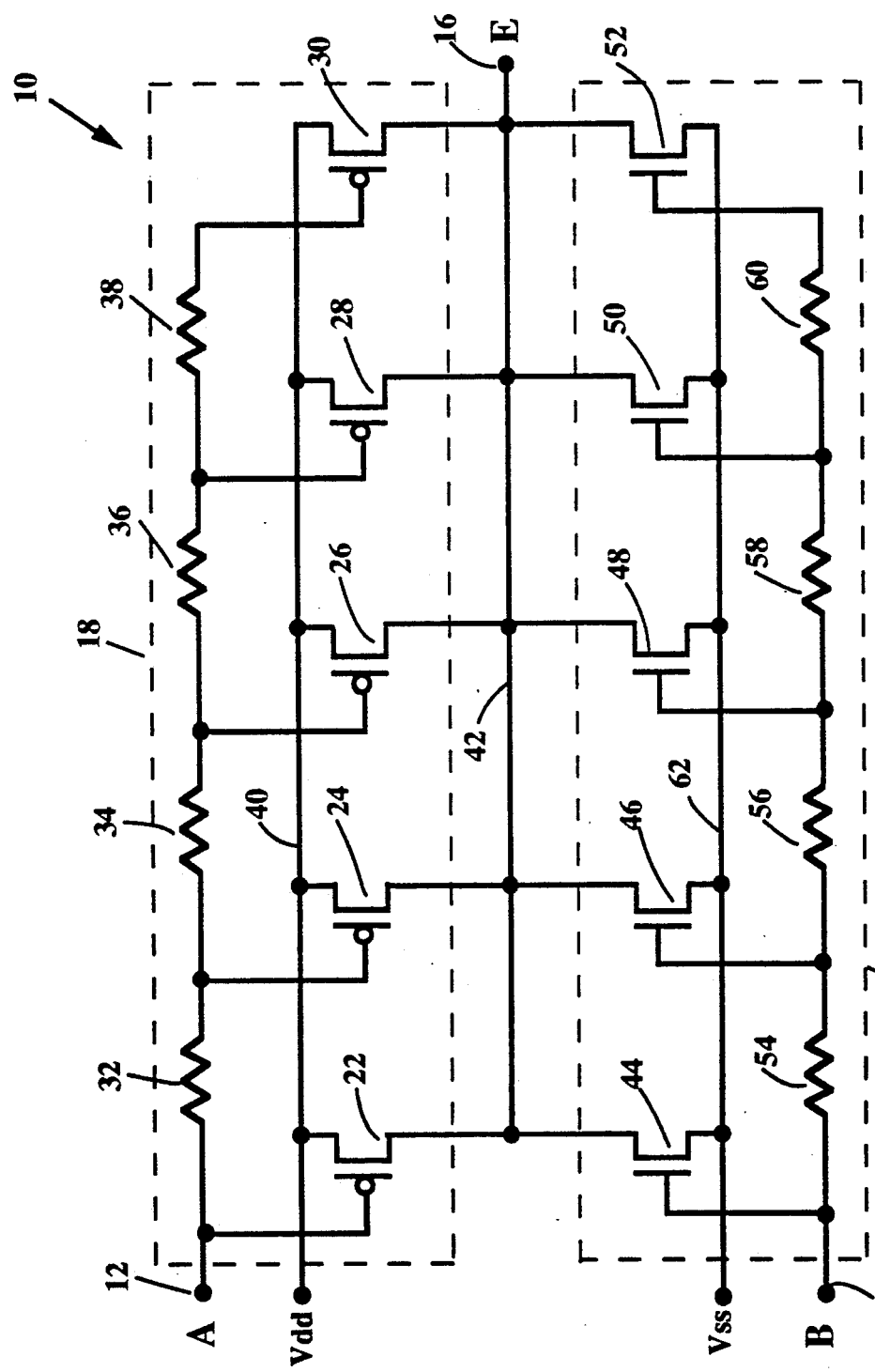
FIG. 1 is a schematic of a first embodiment of a digital output buffer having slew-rate control.

FIG. 1 is a schematic of a first embodiment of a digital output buffer 10 having slew-rate control as it is disclosed in co-pending parent application U.S. Ser. No. 07/316,894 filed Feb. 28, 1989, the disclosure of which is hereby incorporated herein by reference in its entirety. The digital output buffer 10 includes input terminals 12 and 14, an output terminal 16, a pull-up network 18 and a pull-down network 20.

Pull-up network 18 includes a linear array of p-channel MOSFETS (Metal Oxide Semiconductor Field Effect Transistors) 22, 24, 26, 28 and 30 and a number of resistive elements 32, 34, 36 and 38. As described in the aforementioned copending parent application, the resistive elements 32-38 preferably comprise a resistive path through a portion of the polysilicon gates of MOSFETS 22-30, although the resistive elements can optionally comprise discrete resistive elements. Resistive element 32 is coupled between the gates of MOSFETS 22 and 24, resistive element 34 is coupled between the gates of MOSFETS 24 and 26, resistive element 36 is coupled between the gates of MOSFETS 26 and 28 and resistive element 38 is coupled between the gates of MOSFETS 28 and 30. The sources of the MOSFETS 22-30 are coupled to the positive terminal $V_{dd}$ of a power supply (not shown) by a power line 40 and the drains of the MOSFETS 22-30 are coupled to output line 42 which terminates in output terminal 16.

Pull-down network 20 includes a linear array of n-channel MOSFETS 44, 46, 48, 50 and 52 and a number of resistive elements 54, 56, 58 and 60. Again, the resistive elements 54-60 preferably comprise a resistive path through a portion of the polysilicon gates of MOSFETS 44-52, although the resistive elements can optionally comprise discrete resistive elements. Resistive element 54 is coupled between the gates of MOSFETS 44 and 46, resistive element 56 is coupled between the gates of MOSFETS 46 and 48, resistive element 58 is coupled between the gates of MOSFETS 48 and 50 and resistive element 60 is coupled between the gates of MOSFETS 50 and 52. The sources of the MOSFETS 44-52 are coupled to the negative terminal $V_{ss}$ of the aforementioned power supply by a ground line 62 and the drains of the MOSFETS 44-52 are coupled to output line 42.

Each of MOSFETS 22-30 and 44-52 preferably includes a polysilicon gate separated from a semiconductor substrate by a thin gate oxide layer. As mentioned previously, the polysilicon gates are preferably used to provide the resistive elements 32-38 and 54-60. Each of the MOSFETS include an intrinsic capacitor comprising the conductive polysilicon gate and the conductive substrate separated by the insulating gate oxide layer. Therefore, each resistive element is coupled to two capacitive elements creating an RC (resistance × capacitance) delay line. For example, when an input signal A is applied to input terminal 12 it is applied substantially immediately to the gate of MOSFET 22 but is applied to the gate of MOSFET 24 only after an RC delay caused by resistor 32 and the intrinsic capacitances of the MOSFETS 22 and 24 to which it is coupled. Similarly, the signal is not applied to the gate of MOSFET 26 until after an additional RC delay caused by resistive element 34 and the intrinsic capacitances of transistors 24 and 26 to which it is attached, and so forth for MOSFETS 28 and 30. In other words, the resistive elements 32-38 and the MOSFETS 22-30 serve as a multi-tap delay line to sequentially activate MOSFETS 22-30 when the input signal A is at a logical low level. The resistive elements 54-60 and 44-52 operate in a similar fashion to sequentially activate MOSFETS 44-52 when an input signal B on input terminal 14 is at a logical high level.

In operation, the digital output buffer 10 can be operated as an inverting tristate buffer by controlling terminals 12 and 14 separately. The digital output buffer 10 can also be operated as an inverting buffer by coupling terminals 12 and 14 together and as a non-inverting buffer by coupling an inverter to the coupled-together terminals 12 and 14.

When operating as an inverting tristate buffer, an output signal E on output terminal 16 can attain a high-impedance (Hi-Z) state by applying a high logical signal A to the input terminal 12 and a low logical signal B to input terminal 14. This will cause all of the MOSFETS 22-30 and 44-52 to turn off, producing a high impedance at output terminal 16. When not in the Hi-Z state, the input signals A and B at the input terminals 12 and 14 are the same. When input signals A and B are a logical low, MOSFETS 22-30 will turn on and MOSFETS 44-52 will turn off, pulling output line 42 high. When input signals A and B are a logical high, MOSFETS 22-30 will turn off and MOSFETS 44-52 will turn on, pulling output line 42 low. If a Hi-Z state is not required, terminals 12 and 14 can be coupled together, as mentioned previously.

Since the transistors 22-30 and 44-52 turn on and off sequentially, the digital buffer 10 applies current to a load (not shown) attached to terminal 16 in a gradual manner. This slew-rate control reduces the generation of noise and transients on the output line 16, the power line 40 and the ground line 62 which has the desirable effect of reducing data errors and device malfunctions such as latch-up. Unfortunately, the digital buffer 10 develops the aforementioned crowbar current when both the pull-up network 18 and the pull-down network 20 are on simultaneously, such as when one network is being switched on and the other network is being switched off. More specifically, as one network slowly turns on and the other network slowly turns off, for some period of time the MOSFETS of both networks are conducting and large amounts of current can flow from $V_{dd}$ through the MOSFETS 22-30 and MOSFETS 44-52 to $V_{ss}$. The slew-rate control of digital output buffer 10 exasperates the crowbar current effect because the networks are turned off as slowly as they are turned on, increasing the period of time when the MOSFETS of both networks are conducting.

Figure 2:
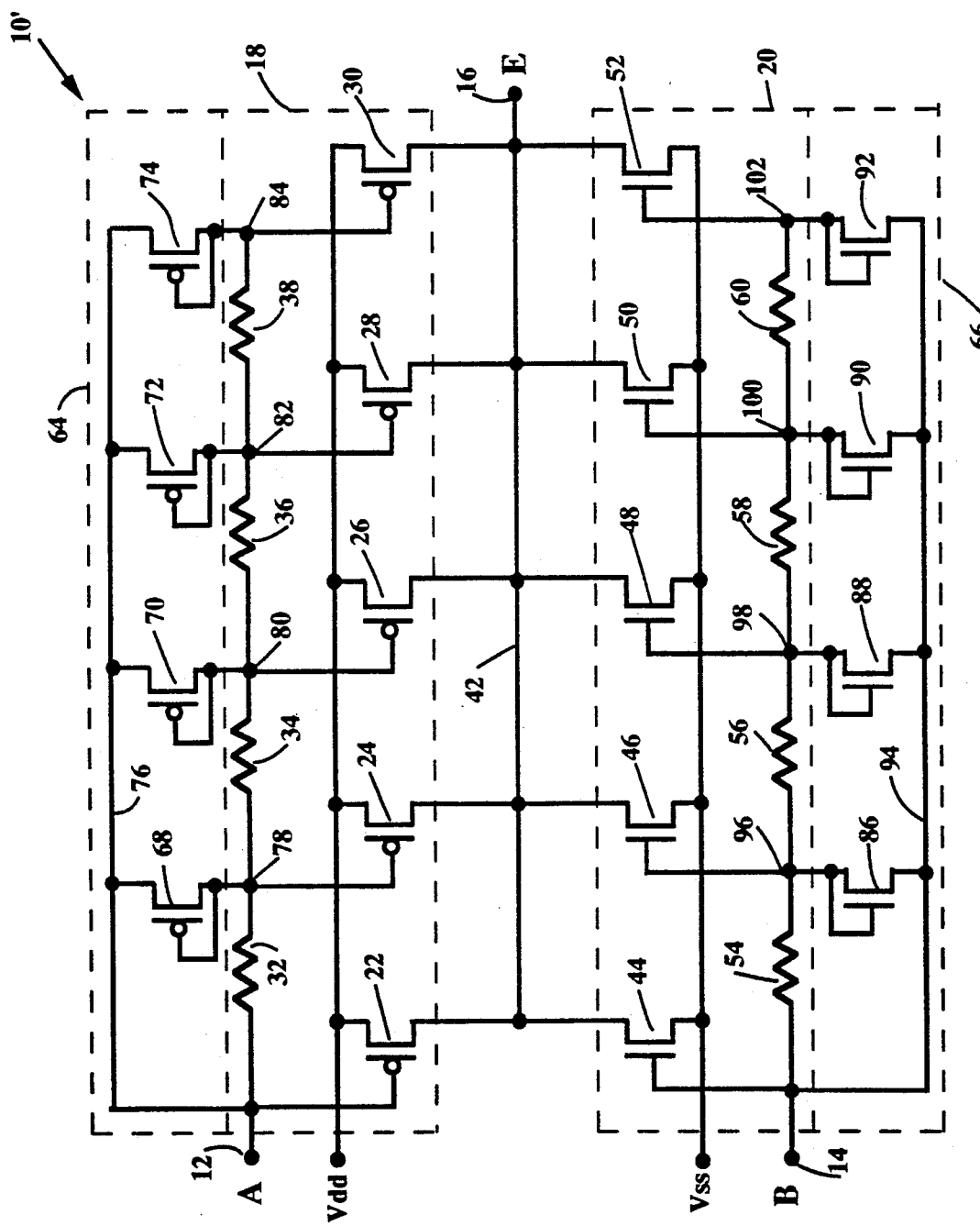
FIG. 2 is a schematic of a second embodiment of a digital output buffer having slew-rate control and crowbar current control.

FIG. 2 illustrates a digital output buffer 10' having both slew-rate control and crowbar current control. The digital output buffer 10' includes the same input terminals 12 and 14, output terminal 16, pull-up network 18, pull-down network 20 and output line 42 as digital output buffer 10 of FIG. 1. The configuration of the pull-up network 18 and pull-down network 20 of digital output buffer 10' is the same as the configuration of pull-up network 18 and pull-down network 20 of digital output buffer 10, as is implied by the use of the same reference numerals for resistive elements 32-38 and 54-60 and MOSFETS 22-30 and 44-52 in both embodiments. Digital output buffer 10' differs from digital output buffer 10 by the addition of diode bypass networks 64 and 66.

Diode bypass network 64 includes four p-channel MOSFETS 68, 70, 72 and 74. The sources of MOSFETS 68-74 are coupled to the input terminal 12 by a line 76 and the gates and drains of MOSFETS 68-74 are coupled to nodes 78, 80, 82 and 84, respectively. Node 78 is coupled to resistive elements 32 and 34 and to the gate of MOSFET 24, node 80 is coupled to resistive elements 34 and 36 and to the gate of MOSFET 26, node 82 is coupled to resistive elements 36 and 38 and to the gate of transistor 28 and node 84 is coupled to resistive element 38 and to the gate of transistor 30.

Diode bypass network 66 includes four n-channel MOSFETS 86, 88, 90 and 92. The drains of MOSFETS 86-92 are coupled to the input terminal 14 by a line 94 and the gates and sources of MOSFETS 86-92 are coupled to nodes 96, 98, 100 and 102, respectively. Node 96 is coupled to resistive elements 54 and 56 and to the gate of MOSFET 46, node 98 is coupled to resistive elements 56 and 58 and to the gate of MOSFET 48, node 100 is coupled to resistive elements 58 and 60 and to the gate of transistor 50 and node 102 is coupled to resistive element 60 and to the gate of transistor 52.

Diode bypass networks 64 and 66 permit the pull-up network 18 and the pull-down network 20 to turn on slowly for slew-rate control but to turn off quickly to minimize crowbar current. Each of MOSFETS 68-74 serve as passive diodes with their anodes coupled to line 76 and their cathodes coupled to nodes 78-84, respectively. Each of MOSFETS 86-92 serve as passive diodes with their cathodes coupled to line 94 and their anodes coupled to nodes 96-102, respectively. The term "passive diode" as used herein means a standard, unswitched, two terminal diode as opposed to active switched devices such as silicon controlled rectifiers (SCRs) and transistors.

The digital output buffer 10' can be operated in a tristate mode as was discussed with reference to digital output buffer 10 of FIG. 1. To operate digital output buffer 10' in an inverting buffer mode, input terminals 12 and 14 are coupled together and comprise a common input to the buffer. The digital output buffer 10' can operate as a non-inverting buffer by coupling an input signal to the buffer to the input terminals 12 and 14 by an inverter.

The operation of the digital output buffer 10' will be discussed with the buffer operating in the inverting buffer mode where input terminals 12 and 14 are coupled together. If a LO or approximately 0 volt signal has been applied to the input terminals 12 and 14 for period of time sufficient for the digital output buffer 10' to reach a steady state, the MOSFETS 44-52 of pull-down network 20 will be off and the MOSFETS 22-30 of pull-up network 18 will be on causing output terminal 16 to be HI or approximately 5 volts ($V_{dd}$).

When a HI is applied to input terminals 12 and 14, the MOSFETS 68-74 of diode bypass network 64 act as forward biased diodes which bypass the resistive elements 32-38 of the pull-up network 18, quickly turning off MOSFETS 22-30. At the same time, MOSFETS 44-52 of the pull-down network 20 turn on slowly and sequentially because the MOSFETS 86-92 of the diode bypass network 66 act as reverse biased diodes and the MOSFETS 44-52 must be turned on through the RC network comprising resistive elements 54-60. Therefore, the signal on output terminal 16 will go momentarily tristate as the pull-up network 18 quickly turns off and will slowly fall to LO as the pull-down network 20 slowly turns on for slew-rate control. There is minimal crowbar current because the pull-up network 18 is essentially turned off as pull-down network 20 is slowly turning on.

When a LO is subsequently applied to input terminals 12 and 14, the MOSFETS 86-92 of diode bypass network 66 act as forward biased diodes to quickly pull the gates of MOSFETS 44-52 to LO, thereby quickly turning off the pull-down network 20. The MOSFETS 68-74 of diode bypass network 64 act as reverse biased diodes so that MOSFETS 22-30 of pull-up network 18 are slowly and sequentially turned on through the RC network including resistive elements 32-38. The signal on output terminal 16 will therefore go momentarily tristate as pull-down network 20 quickly turns off and then will slowly rise to HI as the pull-up network 18 slowly turns on for slew-rate control. Again, there is minimal crowbar current because pull-down network 20 is essentially turned off as pull-up network 18 is slowly turning on.

It should be noted that the control of the crowbar current in buffer 10' is accomplished with passive diodes rather than active devices such as SCRs or transistors. This is very advantageous for efficient and effective integrated circuit (IC) design and more particularly is advantageous in complementary metal oxide semiconductor (CMOS) IC design. This is because, with CMOS, the p-channel MOSFETS are preferably separated from the n-channel MOSFETS for the sake of design efficiency and to prevent undesirable operational effects such as CMOS latch-up.

Practically speaking, it is much easier to place as many p-channel MOSFETS as possible in a single n-well in the semiconductor substrate and as many n-channel MOSFETS as possible in a single p-well in the semiconductor substrate. This is often accomplished by separating the n-well from the p-well by an output pad corresponding to output line 42 in FIGS. 1 and 2. In the present invention, the MOSFETS of the bypass network 64 are of the same type as the MOSFETS of pull-up network 18 and can share a single n-well. Similarly, the MOSFETS of the diode bypass network 66 are of the same type as the MOSFETS of pull-down network 20 and can share a single p-well. Furthermore, since the diode bypass networks comprise passive diode elements, no signal lines are required to be extended into the well to control the operation MOSFETS 68-74 and 86-92. In consequence, the use of passive diodes rather than active components substantially reduces design and interconnection complexity and permits a compact and effect layout of the components of the buffer 10'.

Figure 3:
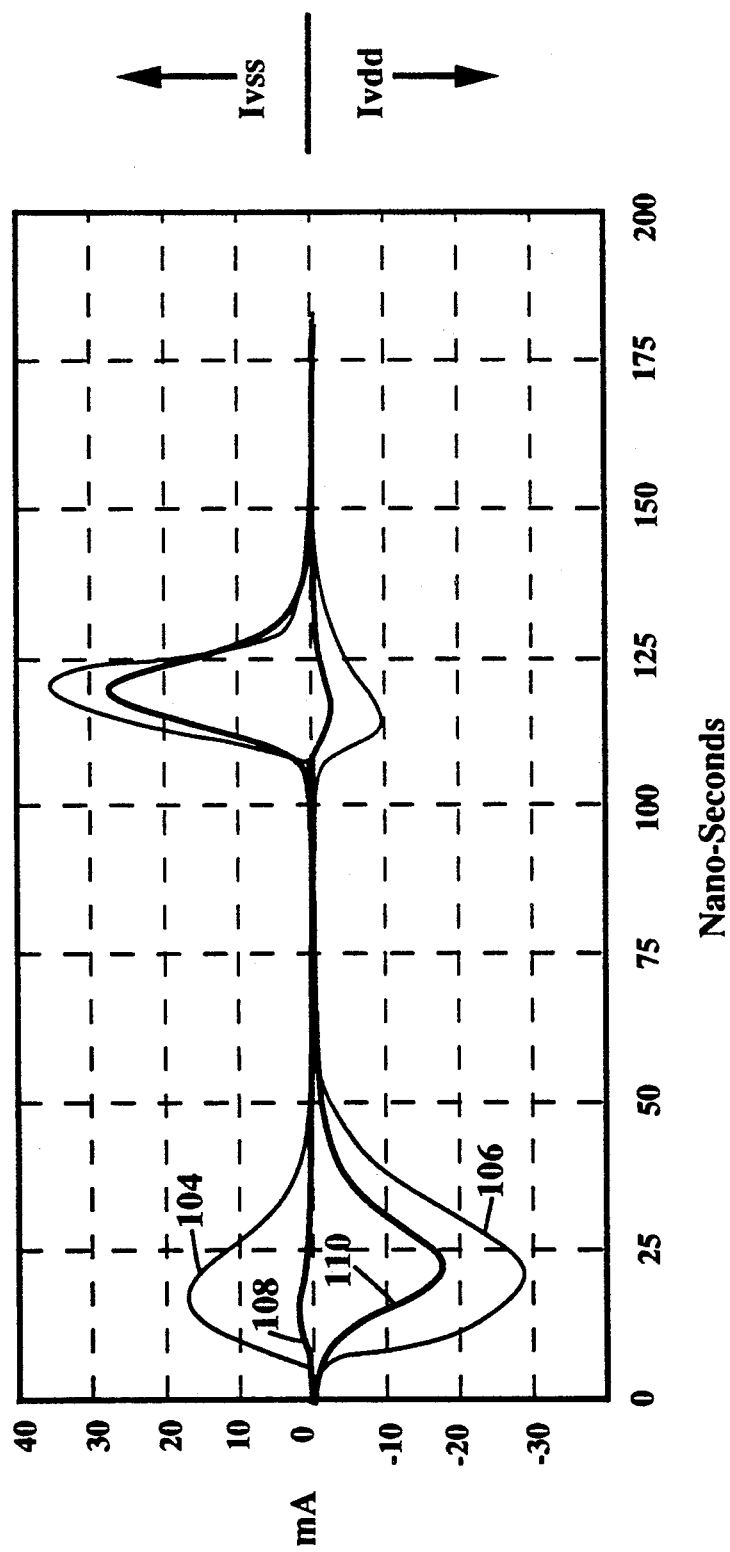
FIG. 3 is a graph comparing the operating characteristics of the embodiments of FIGS. 1 and 2.

The graph of FIG. 3 compares the operation of the two embodiments of the digital output buffers. On the ordinate of the graph the positive power supply current $I_{Vss}$ is plotted as positive current in milliamperes (mA), while the negative power supply current $I_{Vdd}$ is plotted a negative current in mA. The abscissa of the graph is time in nanoseconds. The $I_{Vss}$ and $I_{Vdd}$ currents for the digital output buffer 10 are shown in relatively light lines and the $I_{Vss}$ and $I_{Vdd}$ currents for the digital output buffer 10' are shown in relatively heavy lines. The graph of FIG. 3 was produced by a SPICE simulator available from VLSI Technology, Inc. of San Jose, Calif. as product VLSI-Spice.

The plot 104 corresponds to the $I_{Vss}$ of digital output buffer 10 and the plot 106 corresponds to the $I_{Vdd}$ of the digital output buffer 10. The plots 108 and 110 correspond to the $I_{Vss}$ and $I_{Vdd}$, respectively, of digital output buffer 10'. The two digital output buffers are caused to change state at about 0 nanoseconds and at about 100 nanoseconds. The first change of state is from a HI to a LO at the input to the buffers, which causes an $I_{Vss}$ current of approximately 18 mA in buffer 10 and of about 2 mA in buffer 10'. This same change of state also causes an $I_{Vdd}$ current of about −29 mA in buffer 10 and of about −18 mA in buffer 10'. The current reduction of both $I_{Vdd}$ and $I_{Vss}$ in buffer 10' corresponds to the reduction in the crowbar current.

When buffers are caused to change state at about 100 nanoseconds by changing the inputs to the buffers from a LO to a HI the $I_{Vss}$ current for buffer 10 is about 35 mA, while the $I_{Vss}$ current for the buffer 10' is only about 28 mA. The $I_{Vdd}$ current for buffer 10 is about −10 mA, while the $I_{Vdd}$ current for the buffer 10' is only about −3 mA. Again, buffer 10' has substantially lower crowbar current as evidence by the lower $I_{Vss}$ and $I_{Vdd}$ currents.

While this invention has been described in terms of several preferred embodiments, it is contemplated that various alterations and permutations thereof will become apparent to those skilled in the art. For example, another embodiment of the digital output buffer of the present invention has only a pull-up or a pull-down network which operates in conjunction with an external pull-down or pull-up resistor coupled to output terminal 16. However, these single network embodiments would have slew-rate control in only one transition direction and may therefore not be as desirable as the buffers 10 and 10'. It is therefore intended that the appended claims include all such alterations and permutations as fall within the true spirit and scope of the present invention.

What is claimed is:

1. A buffer comprising:
   input terminal means and output terminal means;
   a linear array of switch elements where each switch element has a control input for switching said switch element on and off, each switch element being coupled between said output terminal and a terminal of an electrical power source;
   means coupling a control input of a first one of said switch elements to said input terminal means;
   delay means coupling a control input of each switch element to the control input of a next switch element; and
   diode means coupled between said input terminal means and said delay means to provide a unidirectional current bypass of said delay means.

2. A buffer as recited in claim 1 wherein said linear array of switch elements, said delay means and said diode means comprise a first network of said buffer and further comprising a second network of said buffer which is similarly configured to said first network.

3. A buffer as recited in claim 2 wherein one of said first network and said second network can selectively pull-up said output terminal means while the other of said first network and said second network can selectively pull-down said output terminal means.

4. A buffer as recited in claim 3 wherein said input terminal means includes a first input terminal coupled to said first network and a second input terminal coupled to said second network.

5. A buffer as recited in claim 3 wherein said switch elements of said first network couple said output terminal means to a positive terminal of said electrical power source and wherein said switch elements of said second network couple said output terminal means to a negative terminal of said electrical power source.

6. A buffer as recited in claim 5 wherein anode means of said diode means of said first network is coupled to said input terminal means and wherein cathode means of said diode means of said second network is coupled to said input terminal means.

7. A buffer as recited in claim 5 wherein said switch elements comprise MOSFETS and wherein said delay means comprise inherent resistive means and capacitance means of said MOSFETS.

8. A buffer as recited in claim 7 wherein the MOSFETS of said first network are of a first polarity type and wherein the MOSFETS of said second network are of a second polarity type.

9. A buffer as recited in claim 7 wherein said diode means includes a MOSFET configured as a diode by coupling its gate to either its source or its drain.

10. A buffer comprising:
    an input terminal and an output terminal;
    a first MOSFET transistor having a gate, a source and a drain, where said gate of said first MOSFET is coupled to said input terminal, where one of said source and drain of said first MOSFET is coupled to said output terminal and where the other of said source and drain of said first MOSFET is coupled to an electrical power source;
    a second MOSFET transistor having a gate, a source and a drain, where one of said source and drain of said second MOSFET is coupled to said output terminal and where the other of said source and drain of said second MOSFET is coupled to said electrical power source;
    resistive means coupled between said gate of said first MOSFET and said gate of said second MOSFET; and
    diode means coupled between said input terminal and said gate of said second MOSFET.

11. A buffer as recited in claim 10 wherein said first and second MOSFETS are coupled to a negative terminal of said electrical power source and further comprising pull-up means coupling said output terminal to a positive terminal of said electrical power source.

12. A buffer as recited in claim 11 wherein a cathode of said diode means is coupled to said input terminal and an anode of said diode means is coupled to said gate of said second MOSFET.

13. A buffer as recited in claim 10 wherein said first and second MOSFETS are coupled to a positive terminal of said electrical power source and further comprising pull-down means coupling said output terminal to a negative terminal of said electrical power source.

14. A buffer as recited in claim 13 wherein an anode of said diode means is coupled to said input terminal and a cathode of said diode means is coupled to said gate of said second MOSFET.

15. A buffer comprising:
    input terminal means and output terminal means;
    pull-up means coupled between said input terminal means and said output terminal means, said pull-up means including a linear array of MOSFETS where each of said MOSFETS has its source coupled to a positive terminal of a power supply and its drain to said output terminal means, where a gate of each MOSFET is coupled to a gate of an adjacent MOSFET by resistive means, and where each resistive means is bypassed to said input terminal means by diode means; and
    pull-down means coupled between said input terminal means and said output terminal means, said pull-up means including a linear array of MOSFETS where each of said MOSFETS has its drain coupled to a negative power source and its source coupled to said output terminal means, where a gate of each MOSFET is coupled to a gate of an adjacent MOSFET by resistive means, and where each resistive means is bypassed to said input terminal means by diode means.

16. A method for providing a buffered digital output in response to a digital input comprising:

slowly turning on a first network which couples an input terminal to an output terminal, said first network being turned on in response to a low digital input signal at said input terminal to provide a first digital output signal at said output terminal, while quickly turning off a second network which couples said input terminal to said output terminal, said second network being turned off by first passive means; and slowly turning on said second network in response to a high digital input signal to provide a second digital output signal, while quickly turning off said first network by second passive means.

17. A method as recited in claim 16 wherein said first passive means comprises first diode means and wherein said second passive means comprises second diode means.

18. A method as recited in claim 17 wherein said first digital output signal is a low digital output signal and said second digital output signal is a high digital output signal.

19. A method as recited in claim 17 wherein said first digital output signal is a high digital output signal and said second digital output signal is a low digital output signal.

* * * * *

UNITED STATES PATENT AND TRADEMARK OFFICE
CERTIFICATE OF CORRECTION

PATENT NO.  : 5,111,075

DATED       : May 5, 1992

INVENTOR(S) : Thomas V. Ferry, et al.

It is certified that error appears in the above-identified patent and that said Letters Patent is hereby corrected as shown below:

On the title page, item [75] Inventors should read as follows:

-- Thomas V. Ferry, San Jose; Jamil Kawa, Santa Clara; Kerry M. Pierce, Fremont; William G. Walker, Saratoga; Michael A. Zampaglione, San Jose; James S. Hsue, San Francisco, all of Calif.--.

Signed and Sealed this

Sixth Day of October, 1992

Attest:

DOUGLAS B. COMER

Attesting Officer

Acting Commissioner of Patents and Trademarks